United States Patent [19]

Spezio

[11] Patent Number: 4,468,766
[45] Date of Patent: Aug. 28, 1984

[54] OPTICAL RF DOWNCONVERTER

[75] Inventor: Anthony Spezio, Laurel, Md.

[73] Assignee: The United States of America as represented by the Secretary of the Navy, Washington, D.C.

[21] Appl. No.: 431,981

[22] Filed: Sep. 30, 1982

[51] Int. Cl.$^3$ .............................................. H04B 9/00
[52] U.S. Cl. ........................................ 370/3; 455/619
[58] Field of Search ................... 370/3; 455/606, 607, 455/611, 617, 618, 619, 46, 47, 59, 61, 71

[56] References Cited

U.S. PATENT DOCUMENTS

| | | | |
|---|---|---|---|
| 3,231,742 | 1/1966 | Siggman | 455/619 |
| 3,328,583 | 6/1967 | Davison | 455/619 |
| 3,415,995 | 12/1968 | Kerr | 455/611 |
| 3,845,294 | 10/1974 | Indig et al. | 250/199 |
| 4,244,045 | 1/1981 | Nosu et al. | 370/3 |
| 4,274,706 | 6/1981 | Tangonan | 350/96.19 |

Primary Examiner—Joseph A. Orsino, Jr.
Attorney, Agent, or Firm—Robert F. Beers; William T. Ellis

[57] ABSTRACT

An optical downconverter with very wide bandwidth operable to separately optically downconvert individual spectrum sections of an RF spectrum, comprising the steps of modulating an optical carrier with the RF spectral width to be downconverted, spatially separating via optical gratings the different sections of the spectrum of the optical carrier sidebands into a plurality of optical channels, generating a different phase-coherent optical local oscillator signal for each optical channel at an appropriate frequency such that the difference between the LO frequency and the particular spectrum section on the given optical channel is equal to a predetermined difference frequency; and mixing each optical channel with its appropriate frequency L.O. and detecting the difference frequency resulting therefrom.

13 Claims, 4 Drawing Figures

4,468,766

OPTICAL RF DOWNCONVERTER

BACKGROUND OF THE INVENTION

The present invention relates generally to frequency conversion devices, and more particularly, to devices having extremely wide band widths for converting to and from optical wavelengths.

It is well known that in order to properly process an incoming RF signal, it is required to down convert the frequency of that signal to baseband. A temporal analysis may then be conducted on such baseband signals via a digital computer. Downconverter functions are conventionally performed via mixing with a local oscillator frequency at an RF frequency. The difference frequency output from this mixing process contains the information from the RF signal at a convenient intermediate frequency for subsequent use. However, the bandwidth at the baseband frequency is usually small compared to the total RF frequency range of the processor. This narrow bandwidth inherent to the use of such a downconversion technique significantly limits the amount of information which can be obtained from a wideband RF signal or from a wide spectral range.

OBJECTS OF THE INVENTION

Accordingly, it is an object of the present invention to perform the frequency conversion function on the RF signal utilizing an extremely wide bandwidth technique.

It is a further object of the present invention to perform the frequency conversion function on an incoming RF signal in the optical domain.

It is a still further object of the present invention to effect a parallel downconversion which covers a wide instantaneous frequency band.

It is yet a further object of the present invention to provide a frequency downconverter with significantly better performance and lower cost than conventional frequency downconverters.

Other objects, advantages, and novel features of the present invention will become apparent from the detailed description of the invention, which follows the summary.

SUMMARY OF THE INVENTION

Briefly, the optical frequency converter of the present invention functions achieves the foregoing objects by optically frequency-converting individual spectrum sections of the input spectral width to be converted. The invention, in one embodiment, may be realized with an optical modulator for modulating a first optical carrier with a signal or signals occurring in an RF input range; an optical detector including a plurality of detecting elements for providing a plurality of output signal channels; a first optical demultiplexer for spatially separating different sections of the frequency spectrum of the first optical carrier sidebands into a plurality of spatially separated optical channels, with each optical channel directed to a different optical detecting element in the optical detector; and a device for generating a plurality of frequency-separated local oscillator signals, one directed to each detecting element, with each L.O. signal at an appropriate frequency such that when it is mixed with the particular spectrum section of the optical channel directed to that detecting element, a difference frequency is obtained which is equal to a predetermined difference frequency range.

In a preferred embodiment, a laser in combination with a beamsplitter are utilized to obtain the first optical carrier and a second optical carrier. The second optical carrier is utilized in generating the L.O. signals to thereby insure phase coherence therebetween. The plurality of different L.O. signals are then obtained by modulating the second optical beam with a signal from a local oscillator source to yield an FM spectrum at optical frequencies to thereby provide multiple local oscillator signals. The optical beam containing these multiple local oscillator signals is then spatially demultiplexed as a function of optical frequency into spatially separate optical paths, with each optical path being directed to impinge on the appropriate one of the plurality of detecting elements to yield the predetermined difference frequency range.

DETAILED DESCRIPTION OF PREFERRED EMBODIMENT

Figure 1:
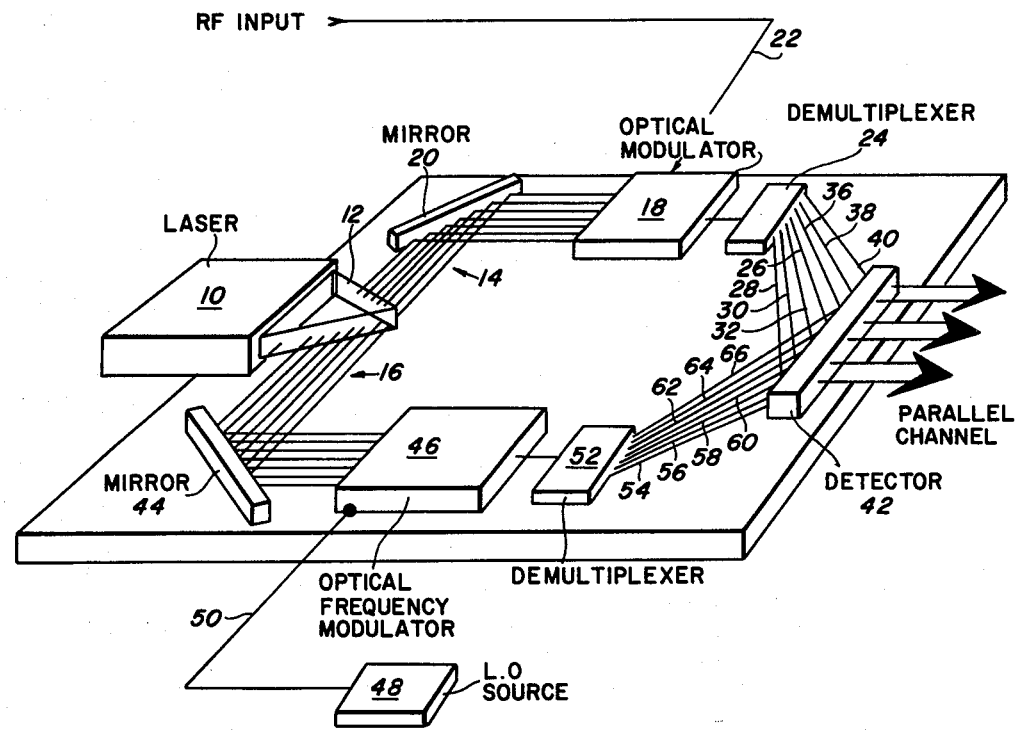
FIG. 1 is a schematic block diagram of one embodiment of the optical frequency converter of the present invention.

The present inventive design for a wideband frequency converter is based on the concept of separately optically frequency converting individual spectrum sections of an RF input range. This device comprises a coherent light source, an optical amplitude modulator, an optical phase modulator, two optical filter banks or demultiplexers, and a converting diode detector array. The device obtains its very wideband operation by modulating an optical carrier with an incoming RF frequency to be frequency-converted, spatially separating the different sections of the spectrum of the optical carrrier sidebands into a plurality of optical channels, generating a different phase-coherent optical local oscillator signal for each optical channel at an appropriate frequency such that the difference between the LO frequency and the particular spectrum section on the given optical channel is equal to a predetermined baseband frequency range, and mixing each optical channel with its appropriate frequency L.O. signal and detecting the difference frequency resulting therefrom. Referring now to the drawings, wherein like reference characters designate like or corresponding parts throughout the views, FIG. 1 is a schematic diagram of one embodiment of the present optical frequency converter. The device comprises a light source 10 for providing a collimated beam of coherent light as an optical carrier to be modulated by an RF signal. In a preferred embodiment, the coherent light output from the light source 10 may also be utilized to form a second optical carrier which may be modulated by a local oscillator frequency to yield a plurality of local oscillator signals. The use of the light output from the light source 10 to provide the optical carriers for the RF and LO signal modulations ensures a common frequency reference for these two optical carriers. The light source 10 may be implemented by means of a variety of coherent optical sources including semi-conductor and gas tube lasers.

In order to utilize the coherent light output from the laser source 10 to provide both the RF and LO optical carriers, a beam splitter 12 is provided to divide the light beam into two phase-coherent collimated beams 14 and 16. In the drawing, the beam splitter is shown as being implemented by means of a prism splitter. Clearly, this beam splitter could also be implemented via a variety of other configurations such as, for example, a system of mirrors with partial transmissivity. The collimated light beam 14 forms a first optical carrier which is provided to an optical modulator 18 via a mirror 20. The collimated beam is coupled into the optical modulator 18 by means of a standard microscopic objective lense (not shown) of the type typically used in microscope assemblies to obtain different magnifications. Accordingly, the wavelength of the optical carrier beam input into the modulator 18 is on the order of one or more microns in dimension.

Figure 2:
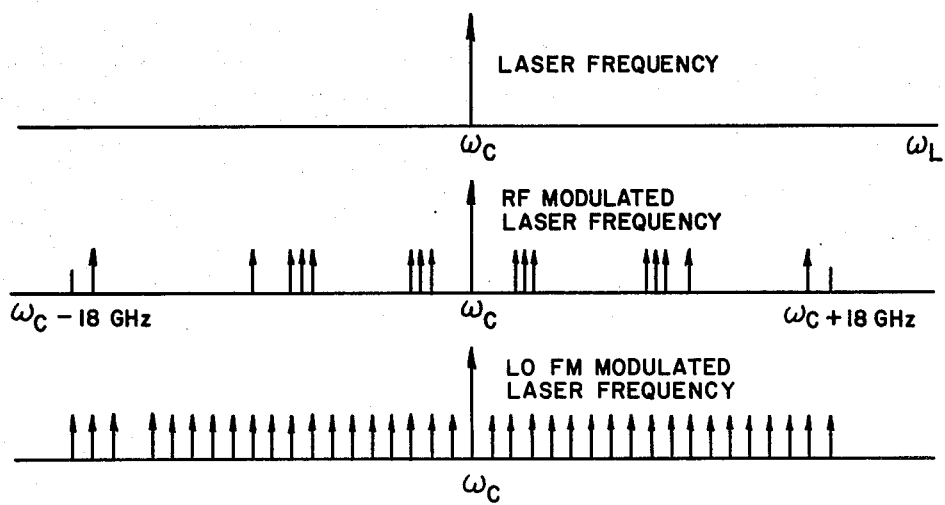
FIG. 2 is a graphical representation in the frequency domain of the initial laser frequency, the RF modulated laser frequency, and the LO FM modulated frequency.

The optical modulator 18 may be an optical amplitude modulator such as, for example, a square law modulator. The optical modulator 18 operates to modulate the first optical carrier 14 with an RF signal input to be frequency-converted supplied by line 22. A spectral diagram of this RF modulation of the optical carrier is shown in FIG. 2 in the second or middle frequency spectrum thereof. The initial laser frequency is shown as the top spectrum. The RF modulated laser frequency spectrum shown in FIG. 2 illustrates only the RF signals modulated onto the optical carrier. The sum and difference spectral lines of harmonics obtained from the modulation are not shown on the diagram.

The optical amplitude modulator 18 may be implemented in a variety of configurations. For example, this device could be implemented with a MACH ZEHNDER interferometer modulator with an electrostatic or traveling wave phase shifter included to generate the optical spectral lines. Likewise, a square-law Gallium Arsenide electro-absorptive modulator employing the Franz Keyldish effect may be utilized. A Gallium Arsenide modulator of the above-noted type has been demonstrated in the reference "A 6 GHz IR Integrated-Optic Modulator" by P.K. Cheo and M. Gilden, IOCC—1977, United Technology Research Center, East Hartford, Conn. The device set forth in this reference acts to modulate RF signals in the 10 GHz to 16 GHz range on to $CO_2$ laser light. As a further alternative, the modulator 18 could be implemented by a magneto-static device operating in the Bragg regime, or a traveling wave electrostatic microstrip modulator.

Figure 3:
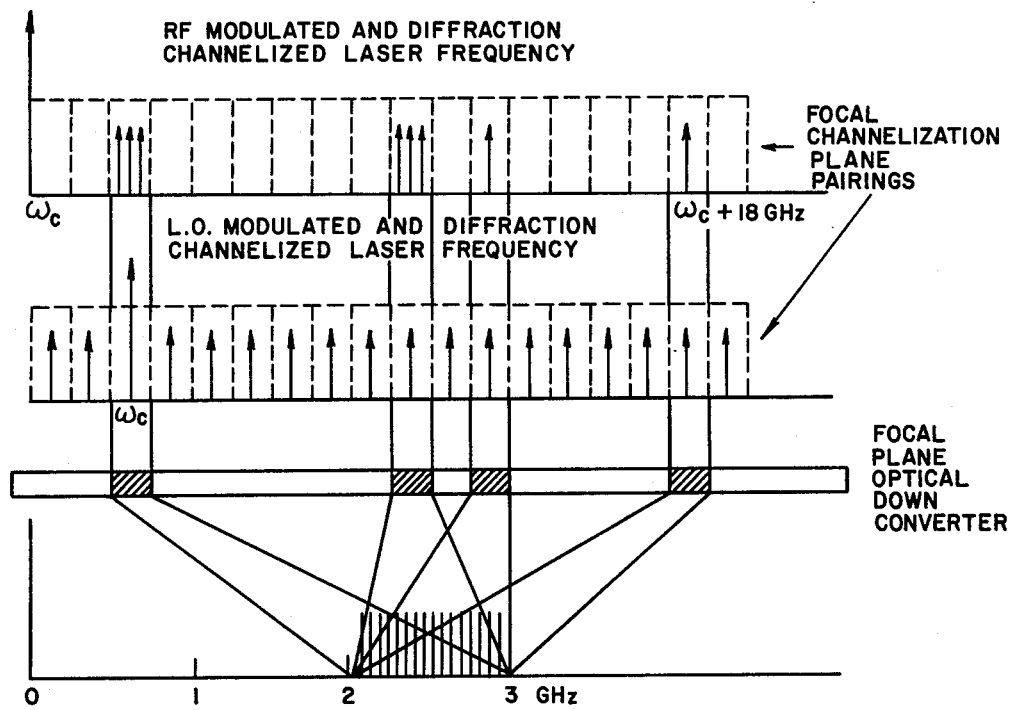
FIG. 3 is a schematic representation of one sideband of the RF modulated and diffracted channelized laser frequency juxtaposed over LO modulated diffracted channelized laser frequencies to be utilized in the frequency conversion.

The modulated IF (intermediate frequency) optical carrier with the RF information in its sidebands is then applied to a demultiplexer 24 which operates to spatially separate the modulated output signal as a function of the optical frequency into a first set of separate optical frequency IF channels 26, 28, 30, 32, 34, 36, 38, and 40. In essence, difference sections of the frequency spectrum of the optical carrier sidebands are spatially separated. This spatial separation is illustrated both in FIG. 1 and in the upper focal channelization plane for the RF modulated and diffraction channelized laser frequency shown in FIG. 3.

Figure 4:
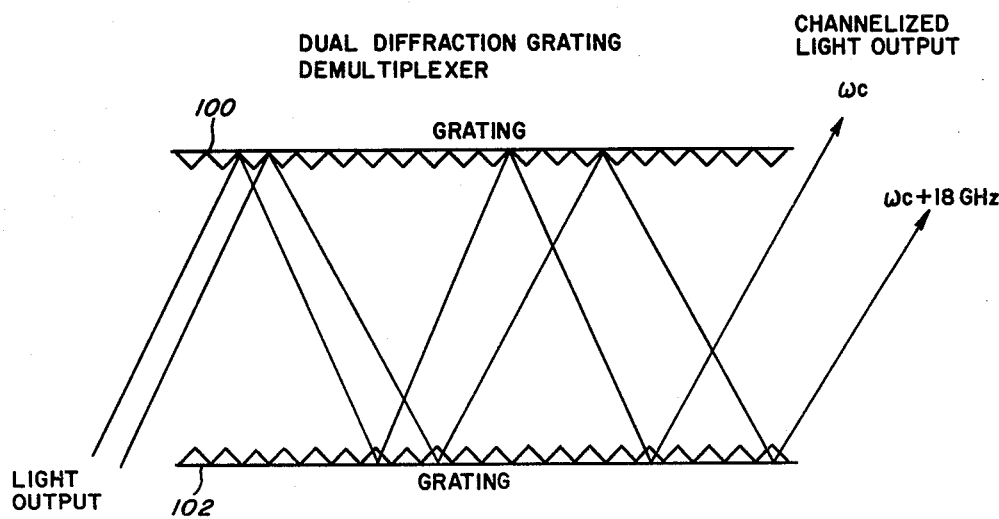
FIG. 4 is a schematic diagram of one embodiment of an optical demultiplexer which may be utilized in the present invention.

The optical demultiplexer 24 may again be implemented via a variety of configurations. In the embodiment projected for construction, a set of two diffraction gratings 100 and 102, properly aligned as shown in FIG. 4, may be utilized to effect this spatial frequency separation or demultiplexing. The grating pair shown acts to gradually separate the spectral components of the band as the signal is reflected between the gratings. This gradual spatial widening or divergence of the band can be seen as the signal progresses from left to right between the gratings in FIG. 4. The distance between the gratings 100 and 102 is set empirically so that the diverging reflected beams do not overlap on consecutive reflections from the same grating. The number of lines per millimeter on the gratings is determined by the frequency, resolution required, and the number of desired reflections between gratings. Such high resolution diffraction grating systems are well known in the art. An alternative demultiplexer that could be utilized is a Fabre Perot Etalon resonator.

Each of the IF optical channels 26-40 containing the different sections of the frequency spectrum of the optical carrier sidebands is applied to a different detecting element in an optical detector 42. This optical detector 42 may be simply realized by means of a diode detector array with each diode detector comprising a detecting element in the system. These diodes may be simply wideband square-law photo detector diodes.

In order to obtain the set of local oscillator frequencies to be mixed with light signals on the individual IF channels 26-40 at the detector 42, the second optical carrier 16 from the beam splitter 12 is applied via a mirror 44 to an optical modulator 46. Again, the collimated light beam of the optical carrier is coupled into the optical modulator 46 by means of a standard microscopic objective lense (not shown) in order to reduce the size of the beam to micron dimensions. By way of example, this optical modulator 46 may comprise an optical phase modulator which phase modulates the optical beam 16 by a single microwave local oscillator frequency via the LO source 48 and the line 50. The purpose of the phase modulation is to generate an FM spectrum at optical frequencies in order to provide multiple different LO sources (a comb of spectral lines) for parallel conversion of the individual spectrum sections on the channels 26-40. By way of example, the optical phase modulator described in the paper "Interferometric Waveguide Modulator With Polarization Independent Operation" by W. K. Burns, T. G. Giallorenzi, R. P. Moeller, and E. S. West, Applied Physics Letters, No. 33, page 944, 1978. The peak phase deviation from the electro-optic phase modulator set out in this paper is a function of the applied microwave signal level on line 50. Frequency deviation resulting from this phase modulation results in a spectrum generated in accordance with the governing Bessel functions. The greater the deviation, the wider the resulting spectrum. The FM spectrum for this device is centered on the optical carrier frequency 16 with spectral lines spaced by the frequency of the applied microwave local oscillator signal on line 50. The spectrum resulting from this FM modulation process in the modulator 46 is shown in the lower spectrum graph of FIG. 2. It can be seen that the spectrum comprises a plurality of harmonics centered on the optical carrier frequency $\simeq_c$. Each of these harmonics in the sidebands of the second optical carrier can be utilized as optical local oscillator signals to downconvert a different optical IF channel.

An analysis was performed to determine the component power level of these harmonics in the FM spectrum. As noted above, the component power levels of these harmonics are set forth by the Bessel function. This function may be used to compute the spectral component power level for a given FM deviation. The results of such a computation with a 15.2 GHz deviation parameter are shown in table 1. Although these results have not been optimized for power spectral flatness, they do indicate a maximum spectral component variation of 14dB. This variation in addition to power spectral density reduction which occurs when optical carrier power is spread to the modulation sidebands thereof requires optical power budgeting. Such optical power budgeting ensures that the requisite amount of power is available in each of the sidebands to drive the detector diodes in the detector 42. Such optical power budgeting can be accomplished quite simply by changing the FM modulation index to thereby vary the amplitude level into the modulator and thus control the power in the sidebands.

In an alternative implementation, a comb of spectral lines at optical frequencies can also be obtained by applying the RF signal from the local oscillator source 48 to a harmonic generator (not shown) to generate a plurality of RF harmonics of the L.O. signal. These harmonics may then be applied to a heterodyne modulator (not shown) in order to modulate the second collimated beam of light therewith.

The output optical signal from the optical frequency modulator 46 is then applied to a demultiplexer 52. The demultiplexer 52 again spatially separates the modulated output signal from the modulator 46 as a function of optical frequency into a second set of separate optical frequency channels or paths 54-66. Each of these optical path 54-66 in the second set comprises one optical sideband or harmonic of the modulated optical carrier signal.

As is well known in the electronics art, frequency conversion (heterodyning) requires the mixing of two signals having a specific frequency difference, which frequency difference is compatible with latter processing components. Accordingly, in order to individually frequency convert each of the spectrum sections in the optical channels 26-40, it is necessary to mix therewith an optical local oscillator signal of appropriate frequency such that the difference frequency resulting therefrom will be a desired system baseband frequency which can be processed by later circuits. To this end, each of the second set of optical channels or paths 54-66 are each directed to impinge on the appropriate detecting element in the detector 42 which has an optical frequency channel with a spectrum section which differs in frequency from that local oscillator optical frequency by the desired system baseband frequency. Accordingly, in FIG. 1 the local oscillator signal on channel 54 is mixed with the optical channel 28, the local oscillator signal on the channel 56 is mixed with the optical channel 30, the local oscillator signal on channel 58 is mixed with optical channel 32, and the local oscillator signal on channel 60 is mixed with the optical channel 26, etc. In the design shown in FIG. 1, both the first and second optical carriers utilized in the modulators 18 and 46 comprise an identical carrier frequency $\simeq_c$. The sideband harmonics of the local-oscillator-modulated optical carrier frequency are equally spaced in frequency starting from the carrier frequency $\simeq_c$ at intervals equal to the local oscillator fundamental frequency. Accordingly, in order to insure that the frequency difference is equal to the appropriate baseband frequency, the channelized optical signals on the channels 54-66 are shifted by an amount equal to the baseband frequency with respect to the channelized optical IF signal 26-40 representing the individual spectrum segments of the optical sideband. This shift, which can be implemented simply by a physical displacement of the optical channel, results in a frequency offset between the optical IF and the optical LO frequency which is thus equivalent to the baseband frequency. Accordingly, each optical IF spectrum segment (from the channels 26-40) is appropriately paired with the proper offset optical L.O. frequency (from channels 54-66) in a separate detector element of the detector 42 to yield the same baseband frequency. The result of this process is that each section of the IF channel spectrum is translated down to the same system microwave baseband frequency. The fact that the information at each detector element is now in the same baseband frequency range and with approximately the same center frequency is illustrated in the bottom graphical depiction of FIG. 3.

Accordingly, the output from the detector 42 comprises a number of parallel output diode connections each providing a different segment of the original RF spectrum demultiplexed and converted to the microwave baseband frequency. Each of these different spectrum segments could then have a separate signal processor therefor depending on the particular system application. For example, each of the parallel output channels from the detector 42 could be digitized and provided directly to its own digital computer for temporal analysis.

The present optical frequency converter can be utilized to accept an instantaneous wideband spectrum, such as, for example, from 0.5 GHz to 18.0 GHz. In the device projected to be constructed, a single microwave local oscillator reference signal of 1.0 GHz is utilized to generate multiple optical local oscillator signals that convert the instantaneous wideband spectrum to 18 baseband channels at the convenient baseband frequency range of 2.0 GHz to 3.0 GHz. Thus, an entire instantaneous wideband RF spectrum of interest is instantaneously and continually demultiplexed and converted to 18 channels of a one GHz bandwidth microwave baseband frequency centered at 2.5 GHz.

In addition to the above-noted advantages, the present optical frequency converter design also has advantages in size, performance, and cost of implementation. This optical frequency converter can be expected to occupy the same size as a single frequency conventional downconverter. Since it will perform parallel channel downconversion, the size advantage based upon the equivalent conventional circuit is approximately equal to the number of channels in the optical circuit. A performance advantage is also derived from having optical circuit parallel outputs and corresponds to an equivalent advantage over conventional technology. Potential cost advantages arise from the use of integrated optical techniques to fabricate the downconverter circuit and are estimated to be an order of magnitude less than with conventional microwave implementation techniques.

The optical downconverter is subject to fabrication in a number of different materials systems. Within the current state of the art, Lithium Niobate is the preferred substrate material. However, other materials such as Gallium Arsenide, Flint Glass and Quartz can be used.

In essence, the present optical frequency-converter performs the functions of a very accurate radio frequency tuner in multiple channels simultaneously and continuously over a broad bandwidth. This function is accomplished by separately frequency converting individual spectral sections of the RF signal of interest in the optical frequency domain via the aforementioned optical network. This device should see wide usage in signal analysis applications.

Obviously many modifications and variations of the present invention are possible in light of the above teachings. It is therefore to be understood that within the scope of the appended claims the invention may be practiced otherwise than as specifically described.

TABLE 1

FREQUENCY MODULATION: CARRIER AND SIDEBAND AMPLITUDES AS A FUNCTION OF
'BETA' = DEVIATION/MODULATING FREQUENCY
... BETA(NOMINAL) = 15.2
... BETA(ACTUAL) = 15.2

| CARR/SIDE No. | MAGNITUDE (AMPL.) | MAGNITUDE (DECIBELS) | DIFFERENCE (DECIBELS) |
|---|---|---|---|
| 0 | 5.41349E.2 | −25.3305 | 0 |
| 1 | 0.195026 | −14.1982 | 11.1323 |
| 2 | 7.98876E-2 | −21.9504 | 3.39004 |
| 3 | 0.173978 | −15.1901 | 10.1404 |
| 4 | 0.148685 | −16.5547 | 8.77579 |
| 5 | 9.57588E-2 | −20.3764 | 4.95403 |
| 6 | 0.212197 | −13.4656 | 11.8648 |
| 7 | 7.15041E-2 | −22.9134 | 8.41707 |
| 8 | 0.146421 | −16.6979 | 8.64252 |
| 9 | 0.225533 | −12.9358 | 12.3946 |
| 10 | 0.120739 | −18.363 | 6.96742 |
| 11 | 6.66599E-2 | −23.5227 | 1.80775 |
| 12 | 0.217234 | −13.2615 | 12.069 |
| 13 | 0.276332 | −11.1714 | 14.1591 |
| 14 | 0.255439 | −11.8543 | 13.4762 |
| 15 | 0.194215 | −14.2344 | 11.0961 |

SUM: CARRIER AND FIRST 15 +/− SIDEBAND POWERS = 0.950816...
IN DECIBELS, = −0.219036

What is claimed and desired to be secured by letters patent of the United States is:

1. A wideband optical frequency converter comprising:
   a light source for generating a first and a second collimated beams of light which are spatially separated and phase coherent;
   a signal input line for providing a signal to be frequency converted;
   a first optical modulator for modulating said first collimated light beam in accordance with the signal on said input line;
   optical detecting means including a plurality of detecting elements for providing a plurality of parallel output signal channels;
   a first spatial demultiplexer for spatially separating the modulated output signal from said first optical modulator as a function of optical frequency into a first set of separate optical frequency channels, each directed to impinge on a different detecting element of said optical detecting means;
   a local oscillator signal;
   a second optical modulator for modulating said second collimated beam of light with a signal from said local oscillator signal to yield a comb of spectral lines at optical frequencies to thereby provide multiple different local oscillator signals;
   a second spatial demultiplexer spatially separating the multiple local oscillator signals from said second optical modulator as a function of optical frequency into a second set of spatially separate optical frequency channels with each optical frequency channel from said second set being directed to impinge on a detecting element having an appropriate optical frequency channel from said first set impinging thereon such that the frequency difference therebetween is equal to a predetermined difference frequency.

2. A frequency converter as defined in claim 1, wherein said light source comprises:
   a laser for generating a collimated beam of coherent light; and
   a beamsplitter for splitting the laser light beam into said first and second collimated beams of light.

3. A frequency converter as defined in claim 2, wherein said first optical modulator comprises a traveling-wave Mach-Zehnder interferometric modulator.

4. A frequency converter as defined in claim 2, wherein said first optical modulator comprises a magneto-static device operating in a Bragg regime.

5. A frequency converter as defined in claim 2, wherein said first optical modulator comprises a traveling-wave electrostatic microstrip modulator.

6. A frequency converter as defined in claims, 2, 3, 4, or 5 wherein said second optical modulator comprises an optical phase modulator.

7. A frequency converter as defined in claim 6, whereinfirst and second demultiplexers each comprise a Fabre-Perot Etalon demultiplexer.

8. A frequency converter as defined in claim 6, wherein said first and second spatial demultiplexers each comprises a set of appropriately positioned optical gratings.

9. A wideband optical frequency converter comprising:
   a signal input line for providing a signal to be frequency converted;
   means for modulating an optical carrier with the signal on said signal input line:
   optical detecting means including a plurality of detecting elements for providing a plurality of output signal channels;
   first means for spatially separating different sections of the frequency spectrum produced by the modulation of the optical carrier into a plurality of spatially separated optical channels, with each channel directed to a different detecting element in said optical detecting means; and
   means for providing a different optical localoscillator signal with a different frequency to each of said different detecting elements, each of said different optical local oscillator signals being phase-coherent with said optical carrier and at an appropriate frequency such that when it is mixed with the particular spectrum section of the optical channel directed to that detecting element, a difference frequency is obtained which is equal to a predetermined difference frequency.

10. A frequency converter as defined in claim 9, wherein said optical carrier modulating means and said local oscillator signal providing means comprise:
   a laser source;
   a beamsplitter for splitting the output from said laser source into a first and second collimated light beams which are spatially separated and phase coherent;

a first optical modulator for modulating said first collimated light beam in accordance with the signal on said input line;

a local oscillator source;

a second optical modulator for modulating said second collimated beam of light with a signal from said local oscillator source to yield a comb of spectral lines at optical frequencies to provide multiple local oscillator sources; and second means for spatially separating the multiple local oscillator optical sources as a function of optical frequency into spatially separate optical paths, with each optical path being directed to impinge on the appropriate one of said plurality of detecting elements to yield said predetermined difference frequency.

11. A frequency converter as defined in claim 10, wherein said first optical modulator comprises a traveling wave Mach-Zehnder interferometric modulator;

wherein said second optical modulator comprises an optical phase modulator; and wherein said first and second means for spatially separating comprise a set of approriately positioned optical gratings.

12. A method for optically frequency converting a signal comprising the steps of:

providing a signal to be frequency converted;

generating an optical carrier;

modulating said optical carrier with the signal to be frequency converted;

spatially separating different sections of the frequency spectrum of the optical carrier sidebands produced in the modulating step into a plurality of optical channels;

generating a different optical local-oscillator signal with a different frequency for each different optical channel, each of said different frequency localoscillator signals being phase-coherent with the optical carrier and at an appropriate frequency such that the difference between each different frequency local oscillator signal and the particular spectral range of the optical channel for which it is generated is equal to a predetermined difference frequency band; and mixing the signal on each optical channel with the different frequency local oscillator signal generated therefor and detecting the difference frequency resulting therefrom.

13. A frequency converting method as defined in claim 12, wherein said local oscillator generating step comprises the steps of:

splitting the optical carrier to yield a second optical beam which is phase-coherent therewith;

generating a local oscillator signal;

modulating said second optical beam with the local oscillator signal to yield a comb of spectral lines at optical frequencies to provide multiple different local oscillator signals;

spatially separating the different local oscillator signals as a function of optical frequency into a set of spatially separate optical paths, with the local oscillator signal on each path being mixed with the appropriate optical channel spectrum section to yield the predetermined difference frequency.

* * * * *